(12) United States Patent
Kuretake

(10) Patent No.: US 10,000,696 B2
(45) Date of Patent: Jun. 19, 2018

(54) LIGHT-EMITTING CERAMIC, LIGHT-EMITTING ELEMENT, AND LIGHT-EMITTING DEVICE

(71) Applicant: Murata Manufacturing Co., Ltd., Nagaokakyo-shi, Kyoto-fu (JP)

(72) Inventor: Satoshi Kuretake, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 280 days.

(21) Appl. No.: 14/806,707

(22) Filed: Jul. 23, 2015

(65) Prior Publication Data

US 2015/0329775 A1    Nov. 19, 2015

Related U.S. Application Data

(63) Continuation of application No. PCT/JP2014/050965, filed on Jan. 20, 2014.

(30) Foreign Application Priority Data

Jan. 30, 2013  (JP) .................................. 2013-015422

(51) Int. Cl.
*C04B 35/505* (2006.01)
*C04B 35/48* (2006.01)
(Continued)

(52) U.S. Cl.
CPC .......... *C09K 11/7701* (2013.01); *B32B 18/00* (2013.01); *C04B 35/457* (2013.01); *C04B 35/48* (2013.01); *C04B 35/486* (2013.01); *C04B 35/50* (2013.01); *C04B 35/505* (2013.01); *C09K 11/7769* (2013.01); *H01L 33/502* (2013.01);
(Continued)

(58) Field of Classification Search
CPC combination set(s) only.
See application file for complete search history.

(56) References Cited

U.S. PATENT DOCUMENTS

2008/0233406 A1    9/2008  Hayashi
2011/0316937 A1*  12/2011  Arakawa .............. B41J 2/14233
                                                                    347/68
(Continued)

FOREIGN PATENT DOCUMENTS

WO    WO 2007/060816 A1    5/2007
WO    WO 2011/158580 A1    12/2011
WO    WO 2013/058065 A1    4/2013

OTHER PUBLICATIONS

M.A. Subramanian: New Pyrochlores of the Type (RM)(BiPb)O7 (R=rara earth; M=Ba, Sr, Ca); Mat. Res. Bull., vol. 25, pp. 107-111, 1990.
(Continued)

*Primary Examiner* — Nimeshkumar Patel
*Assistant Examiner* — Jacob R Stern
(74) *Attorney, Agent, or Firm* — Arent Fox LLP

(57) ABSTRACT

A light-emitting ceramic that contains, as a major component thereof, a pyrochlore compound represented by $ABO_w$, wherein A includes at least one element selected from the group consisting of La, Y, Gd, Yb and Lu, B includes Bi and at least one element selected from the group consisting of Zr, Sn and Hf, and W is a positive number.

19 Claims, 6 Drawing Sheets

(51) Int. Cl.
C09K 11/77 (2006.01)
C04B 35/50 (2006.01)
H01L 33/50 (2010.01)
C04B 35/457 (2006.01)
C04B 35/486 (2006.01)
B32B 18/00 (2006.01)

(52) U.S. Cl.
CPC ............... *C04B 2235/3224* (2013.01); *C04B 2235/3225* (2013.01); *C04B 2235/3227* (2013.01); *C04B 2235/3244* (2013.01); *C04B 2235/3293* (2013.01); *C04B 2235/3298* (2013.01); *C04B 2235/6585* (2013.01); *C04B 2235/6587* (2013.01); *C04B 2235/664* (2013.01); *C04B 2235/81* (2013.01); *C04B 2235/9646* (2013.01); *C04B 2235/9653* (2013.01); *C04B 2237/348* (2013.01)

(56) References Cited

U.S. PATENT DOCUMENTS

2013/0105697 A1* 5/2013 Kuretake .............. C04B 35/457
250/361 R

2014/0209954 A1 7/2014 Kuretake

OTHER PUBLICATIONS

International Search Report dated Apr. 22, 2014, in International Patent Application No. PCT/JP2014/050965.
Li, K. et al., "Low-temperature synthesis and structure characterization of the serials $Y_2-\sigma Bi\sigma Sn_2O_7$ ($\sigma$=0-2.0) nanocrystals", Journal of Solid State Chemistry 179, 2006, pp. 1029-1034.
McCauley, R.A. et al., "Luminescence as an Indication of Distortion in $A3+2$ $B4+2$ $O7$ Type Pyrochlores", Journal of Luminescence 6, 1973, pp. 105-115.
Srivastava, A.M. et al., "On the Quenching of $Bi^{3+}$ Limunescence in the Pyrochlore $Gd_2GaSbO_7$", Journal of Solid State Chemistry 146, 1999, pp. 494-498.
Srivastava, A.M. et al., "On the impurity trapped excition luminescence in $La_2Zr_2O_7$ : $Bi^{3+}$", Journal of Luminescence 81, 1999, pp. 293-300.
Srivastava A.M. "On the luminescence of $Bi^{3+}$ in the pyrochlore $Y_2Sn_2O_7$", Materials Research Bulletin 37, 2002, pp. 745-751.
Written Opinion of the International Searching Authority dated Apr. 22, 2014, in International Patent Application No. PCT/JP2014/050965.

* cited by examiner

LIGHT-EMITTING CERAMIC, LIGHT-EMITTING ELEMENT, AND LIGHT-EMITTING DEVICE

CROSS REFERENCE TO RELATED APPLICATIONS

The present application is a continuation of International application No. PCT/JP2014/050965, filed Jan. 20, 2014, which claims priority to Japanese Patent Application No. 2013-015422, filed Jan. 30, 2013, the entire contents of each of which are incorporated herein by reference.

FIELD OF THE INVENTION

The present invention relates to a light-emitting ceramic, a light-emitting element, and a light-emitting device.

BACKGROUND OF THE INVENTION

Heretofore, a light-emitting ceramic which emits light different in a wavelength from excitation light when the excitation light enters a light-emitting element, is known. For example, Patent Document 1 describes, as an example thereof, a light-emitting ceramic formed by heat-treating, in a reducing atmosphere, a ceramic that contains, as a major component, a pyrochlore-type compound represented by $ABO_w$ (wherein A includes at least one element selected from the group consisting of La, Y, Gd, Yb and Lu, and 0 to 5 mol % of Bi, B is at least one element selected from the group consisting of Sn, Zr and Hf, and W is a positive number for maintaining electrical neutrality).
Patent Document 1: WO 2011/158580 A1

SUMMARY OF THE INVENTION

There are requests for the enhancement of quantum efficiency of emission for light-emitting ceramics.

It is a main object of the present invention to provide a light-emitting ceramic which emits light in a high quantum yield.

A light-emitting ceramic according to the present invention is formed by heat-treating, in a reducing atmosphere, a ceramic that contains, as a major component, a pyrochlore-type compound represented by $ABO_w$ (wherein A includes at least one element selected from the group consisting of La, Y, Gd, Yb and Lu, B includes Bi and at least one element selected from the group consisting of Zr, Sn and Hf, and W is a positive number for maintaining electrical neutrality).

In a specific aspect of the light-emitting ceramic according to the present invention, the B contains Bi in an amount of 0.001 mol % to 5 mol %.

In another specific aspect of the light-emitting ceramic according to the present invention, a light transmittance in a wavelength of 450 nm to 800 nm when a thickness of the ceramic is 1 mm, is 50% or more.

In still another specific aspect of the light-emitting ceramic according to the present invention, an emission quantum yield achieved when the light-emitting ceramic is irradiated with the excitation light is 40% or more.

In yet another specific aspect of the light-emitting ceramic according to the present invention, the A does not contain Bi.

A light-emitting element according to the present invention includes a wavelength conversion unit. The wavelength conversion unit contains the light-emitting ceramic according to the present invention.

In a specific aspect of the light-emitting element according to the present invention, the light-emitting element further comprises another wavelength conversion unit different in an emission wavelength from the wavelength conversion unit.

In another specific aspect of the light-emitting element according to the present invention, another wavelength conversion unit contains the light-emitting ceramic according to the present invention.

A light-emitting device according to the present invention includes a light-emitting element according to the present invention and a light source. The light source emits excitation light for the light-emitting element to the light-emitting element.

In accordance with the present invention, it is possible to provide a light-emitting ceramic having a high emission quantum yield.

DETAILED DESCRIPTION OF THE INVENTION

Figure 1:
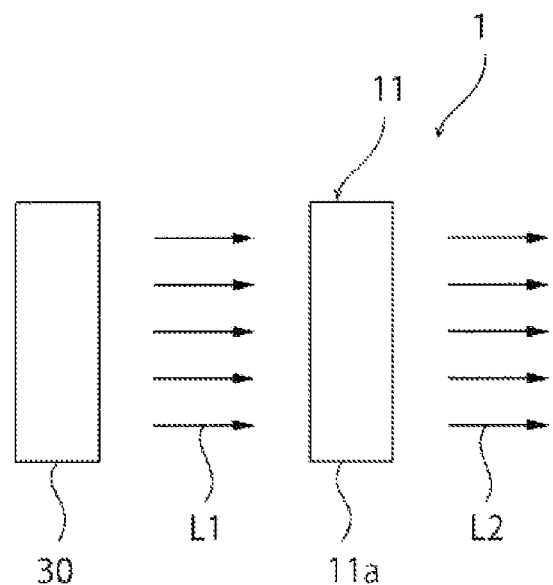
FIG. 1 is a schematic side view of a light-emitting device in a first embodiment.

Hereinafter, one preferred embodiment of the present invention will be described. However, the following embodiment is merely exemplification. The present invention is not limited to the following embodiment at all.

Further, in each drawing to be referred to in embodiments or the like, members having the substantially same function are denoted by the same symbol and referred to by the same symbol. Drawings to be referred to in embodiments or the like are schematically drawn. A dimensional ratio between objects drawn in the drawings may be different from a real dimensional ratio between objects.

The dimensional ratio between objects may be different between drawings. A concrete dimensional ratio between objects is to be determined in consideration of the following description.

First Embodiment

FIG. 1 is a schematic side view of a light-emitting element in a first embodiment. As shown in FIG. 1, a light emitting device 1 includes a light source 30 and a light-emitting element 11. In the present embodiment, the light-emitting element 11 is composed of a wavelength conversion unit 11a. The wavelength conversion unit 11a contains a light-emitting ceramic. The light-emitting ceramic emits a fluorescence L2 when an excitation light L1 enters the light-emitting ceramic. Therefore, when the excitation light L1 enters the wavelength conversion unit 11a, the wavelength conversion unit 11a emits a fluorescence L2. The light source 30 emits the excitation light L1 to the wavelength conversion unit 11a of the light-emitting element 11. The light source 30 can be composed of, for example, an LED (light emitting diode) or a laser light source.

The light-emitting ceramic contained in the wavelength conversion unit 11a is formed by heat-treating, in a reducing atmosphere, a ceramic that contains, as a major component, a pyrochlore-type compound represented by $ABO_W$ (wherein A includes at least one element selected from the group consisting of La, Y, Gd, Yb and Lu, B includes Bi and at least one element selected from the group consisting of Zr, Sn and Hf, and W is a positive number for maintaining electrical neutrality). For this reason, the light-emitting ceramic can achieve a higher emission quantum yield than, for example, a light-emitting ceramic formed by heat-treating, in a reducing atmosphere, a ceramic that contains, as a major component, a pyrochlore-type compound which contains Bi at an A site and does not contains Bi at a B site, as described in Patent Document 1.

From the viewpoint of achieving a higher emission quantum yield, the B contains Bi in an amount of preferably 0.001 mol % to 5 mol %, more preferably 0.01 mol % to 3 mol %, and moreover preferably 0.05 mol % to 1 mol %. Further, in light-emitting ceramic, a light transmittance in a wavelength of 450 nm to 800 nm when a thickness of the ceramic is 1 mm, is preferably 50% or more, more preferably 60% or more, and moreover preferably 70% or more. It is preferred that the A does not contain Bi. In the light-emitting ceramic, an emission quantum yield achieved when the light-emitting ceramic is irradiated with the excitation light is preferably 40% or more, more preferably 50% or more, and moreover preferably 60% or more.

In the ceramic that contains a pyrochlore-type compound represented by $ABO_W$ as a major component, A may be composed of at least one element selected from the group consisting of La, Y, Gd, Yb and Lu, and B may be composed of Bi and at least one element selected from the group consisting of Zr, Sn and Hf. A preferably includes La. B preferably includes Zr. As the ceramic that contains a pyrochlore-type compound represented by $ABO_W$ as a major component, $La(Zr_{(1-x)}Bi_x)O_W$ is preferably used. In the $La(Zr_xBi_{(1-x)})O_W$, x is preferably 0.0001 to 0.01, and more preferably 0.0005 to 0.005.

In order to obtain the ceramic containing, as a major component, a pyrochlore-type compound represented by $ABO_W$ substituted with Bi at the A site, for example, $Bi_2O_3$ is preferably used as a Bi source. On the other hand, in order to obtain the ceramic containing, as a major component, a pyrochlore-type compound represented by $ABO_W$ substituted with Bi at the B site, for example, $NaBiO_3$ is preferably used as a Bi source. As described above, by appropriately selecting the Bi source, for example, it is possible to determine whether Bi is introduced into the A site or the B site.

In addition, the wavelength conversion unit 11a may contain a plural kinds of ceramics.

The ceramic represented by $ABO_W$ may include impurities which are inevitably immixed (hereinafter, referred to as "inevitable impurities") besides A, B and O components. Specific examples of the inevitable impurities include $SiO_2$, $B_2O_3$ and $Al_2O_3$.

Hereinafter, another example of a preferred embodiment of the present invention will be described. In the following description, a member having a function substantially common to that of the First Embodiment is denoted by a common symbol and referred to by the common symbol, and its description will be omitted.

Second Embodiment

Figure 2:
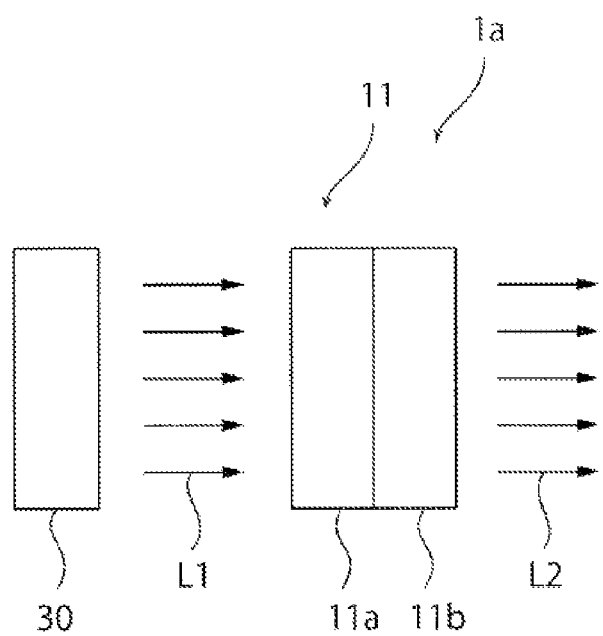
FIG. 2 is a schematic side view of a light-emitting device in a second embodiment.

FIG. 2 is a schematic side view of a light-emitting device in a second embodiment. In the light-emitting device 1a shown in FIG. 2, the light-emitting element 11 has a wavelength conversion unit 11a and another wavelength conversion unit 11b. That is, the light-emitting element 11 has a plurality of wavelength conversion units 11a and 11b.

Since the wavelength conversion unit 11b contains a light-emitting ceramic different from the light-emitting ceramic contained in the wavelength conversion unit 11a, the wavelength conversion unit 11a is different in an emission wavelength from the wavelength conversion unit 11b. Therefore, according to the light emitting device 1a, broad-band emitted light can be obtained. For example, it is also possible to obtain white emitted light. In addition, an excitation wavelength of the wavelength conversion unit 11a and an excitation wavelength of the wavelength conversion unit 11b may be the same or may be different. When at least one of the wavelength conversion unit 11a and the wavelength conversion unit 11b contains a plural kinds of light-emitting ceramics, the same kind of light-emitting ceramic may be contained in both of the wavelength conversion unit 11a and the wavelength conversion unit 11b.

From the viewpoint of achieving a high emission quantum yield, it is preferred that the light-emitting ceramic contained in the wavelength conversion unit 11b is also formed by heat-treating, in a reducing atmosphere, a ceramic that contains, as a major component, a pyrochlore-type compound represented by $ABO_W$ (wherein A includes at least one element selected from the group consisting of La, Y, Gd, Yb and Lu, B includes Bi and at least one element selected from the group consisting of Zr, Sn and Hf, and W is a positive number for maintaining electrical neutrality).

Further, the light-emitting ceramic emits light with a wide wavelength band compared with a typical phosphor for a white LED such as a Ce:YAG phosphor, the light-emitting ceramic being formed by heat-treating, in a reducing atmosphere, a ceramic that contains, as a major component, a pyrochlore-type compound represented by $ABO_W$ (wherein A includes at least one element selected from the group consisting of La, Y, Gd, Yb and Lu, B includes Bi and at least one element selected from the group consisting of Zr, Sn and Hf, and W is a positive number for maintaining electrical neutrality). Accordingly, when at least one of the wavelength conversion unit 11a and the wavelength conversion unit 11b contains the light-emitting ceramic formed by heat-treating, in a reducing atmosphere, a ceramic containing a pyrochlore-type compound represented by $ABO_W$ as a major component, emitted light with a wider band is easily obtained.

Third to Sixth Embodiments

Specific examples of constitution of the light-emitting device are shown in FIGS. 3 to 6.

Figure 3:
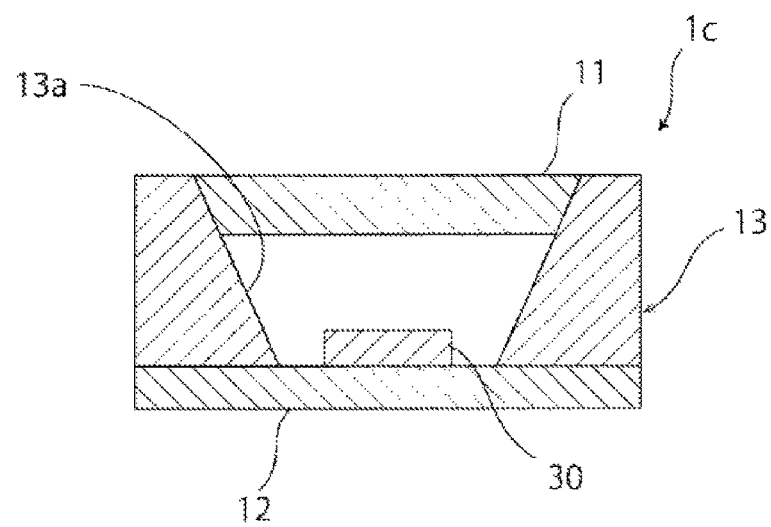
FIG. 3 is a schematic sectional view of a light-emitting device in a third embodiment.

In the light-emitting device 1c shown in FIG. 3, a light source 30 is disposed on a substrate 12. Further, a reflector 13 is disposed on the substrate 12. A through hole 13a is provided for the reflector 13, and the light source 30 is placed within the through hole 13a. The light-emitting element 11 is supported by the reflector 13 apart from the light source 30. By disposing the reflector 13 like the light-emitting device 1c, it is possible to improve the efficiency of excitation light incidence on the light-emitting element 11, the excitation light being emitted from the light source 30. Moreover, the efficiency of light emitted from the light-emitting element 11 can also be improved. From the viewpoint of achieving higher efficiency of light incidence, at least a part of the surface on a side of the light source 30 of the light-emitting element 11 may be processed into a lens shape or a moth-eye structure. From the viewpoint of achieving higher efficiency of light to be emitted, at least a part of the surface opposite to the side of the light source 30 of the light-emitting element 11 may be processed into a lens shape or a moth-eye structure.

Figure 4:
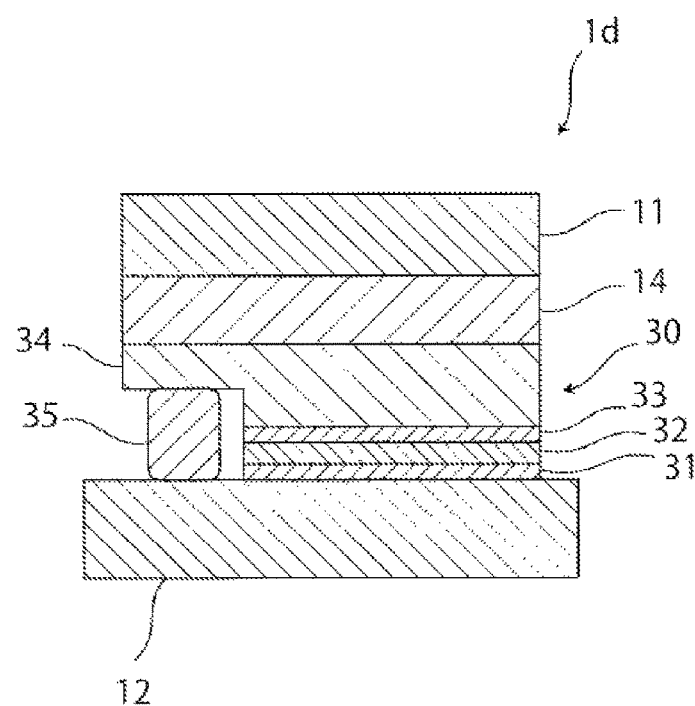
FIG. 4 is a schematic sectional view of a light-emitting device in a fourth embodiment.

In the light-emitting device 1d shown in FIG. 4, the light-emitting element 11 and the light source 30 are connected to each other with an epitaxial wafer 14 interposed therebetween. The light-emitting element 11 and the epitaxial wafer 14 may be connected to each other by, for example, a method of using an adhesive or a method of utilizing heat diffusion. The epitaxial wafer 14 is formed by, for example, sapphire, silicon carbide, silicon, aluminum nitride, or gallium nitride.

In the light-emitting device 1d, the light source 30 is composed of a laminate in which an anode electrode 31, a p-type layer 32, an emission layer 33, and an n-type layer 34 are laminated in this order. The p-type layer 32 is electrically connected to the anode electrode 31. The n-type layer 34 is electrically connected to the cathode electrode 35.

Figure 5:
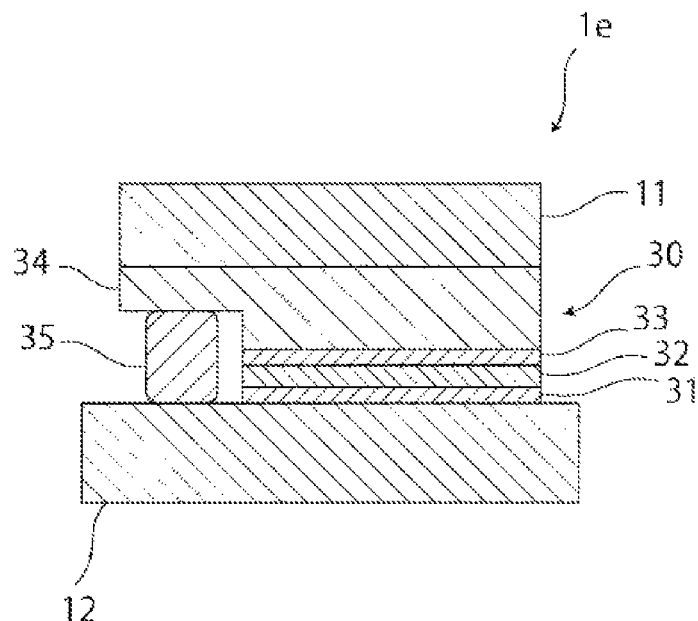
FIG. 5 is a schematic sectional view of a light-emitting device in a fifth embodiment.

In the light-emitting device 1e shown in FIG. 5, the light-emitting element 11 and the light source 30 are directly connected to each other without epitaxial wafer 14 interposed therebetween.

Figure 6:
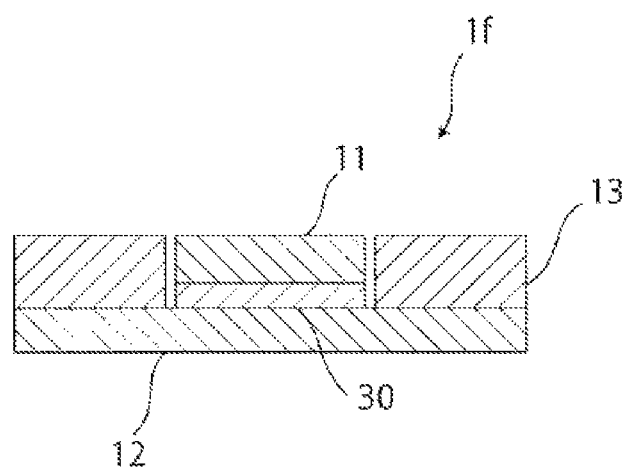
FIG. 6 is a schematic sectional view of a light-emitting device in a sixth embodiment.

In the light-emitting device 1f shown in FIG. 6, the light-emitting element 11 and the light source 30 are disposed in contact with each other in contrast to the light-emitting device 1c.

Experiment Example 1

First, high purity $La(OH)_3$, $Gd_2O_3$, $Y_2O_3$, $Yb_2O_3$, $ZrO_2$, $HfO_2$, $SnO_2$, $Bi_2O_3$ and $NaBiO_3$ were prepared as raw materials. These raw materials were weighed so as to have composition 1 to composition 40 shown in Table 1 below, and wet-mixed in a ball mill for 20 hours. Herein, for the compositions 1, 2, 11, 16, 21, 26, 31 (composition marked with "* (asterisk)") in which the A site is poor, $Bi_2O_3$ was used as a raw material of Bi, and for other compositions, $NaBiO_3$ was used as a raw material of Bi. The resulting mixture was dried, and then calcined at 1300° C. for 3 hours to obtain a calcined product. The calcined product was put into a ball mill together with water, an organic dispersant and an organic binder, and wet-pulverized for 12 hours. Next, the resulting pulverized product was used and wet-shaped to prepare a disc-like compact of 30 mm in diameter and 5 mm in thickness. The prepared compact was embedded in a powder having the composition virtually identical to that of the compact and fired at a temperature of 1700° C. for 20 hours in an oxygen atmosphere (oxygen concentration: about 98%) to obtain a sintered body. Both surfaces of each of the obtained sintered bodies were subjected to mirror polishing to form a substrate having the thickness of 1.0 mm. Thereafter, the substrate was divided into two substrates, and one of the divided substrates was not heat-treated and the other substrate was heat-treated in a reduction atmosphere of a $N_2/H_2/H_2O$ mixed gas (oxygen partial pressure: $1\times10^{-13}$ MPa). A maximum temperature of the heat treatment was set to 1000° C. and a retention time at 1000° C. was set to 3 hours.

TABLE 1

| Composition Number | Compositional Ratio | | | | | | | | | Quantum yield (%) * at irradiation with light of 340 nm (wavelength) | | Linear Transmittance (%) @700 nm |
| --- | --- | --- | --- | --- | --- | --- | --- | --- | --- | --- | --- | --- |
| | A | | | | | B | | | | Before Reduction | After Reduction | After Reduction |
| | La | Y | Gd | Lu | Yb | Zr | Sn | Hf | Bi | | | |
| 1* | 0.9980 | | | | | 1.0000 | | | 0.0020 | 0.0 | 32.1 | 77.2 |
| 2* | 0.9900 | | | | | 1.0000 | | | 0.0100 | 0.3 | 30.3 | 76.7 |
| 3 | 1.0000 | | | | | 0.99999 | | | 0.00001 | 0.0 | 46.8 | 77.5 |
| 4 | 1.0000 | | | | | 0.9999 | | | 0.0001 | 0.0 | 89.3 | 77.2 |
| 5 | 1.0000 | | | | | 0.9995 | | | 0.0005 | 0.0 | 91.6 | 77.5 |
| 6 | 1.0000 | | | | | 0.9980 | | | 0.0020 | 0.0 | 94.2 | 77.3 |
| 7 | 1.0000 | | | | | 0.9950 | | | 0.0050 | 0.0 | 95.2 | 77.3 |
| 8 | 1.0000 | | | | | 0.9900 | | | 0.0100 | 0.0 | 85.4 | 77.1 |
| 9 | 1.0000 | | | | | 0.9700 | | | 0.0300 | 0.1 | 53.6 | 76.4 |
| 10 | 1.0000 | | | | | 0.9500 | | | 0.0500 | 0.1 | 40.8 | 72.6 |
| 11* | 0.9900 | | | | | | 1.0000 | | 0.0100 | 0.0 | 21.4 | 72.4 |
| 12 | 1.0000 | | | | | | 0.9995 | | 0.0005 | 0.0 | 89.3 | 71.3 |
| 13 | 1.0000 | | | | | | 0.9980 | | 0.0020 | 0.0 | 88.6 | 73.1 |
| 14 | 1.0000 | | | | | | 0.9900 | | 0.0100 | 0.0 | 72.1 | 72.6 |
| 15 | 1.0000 | | | | | | 0.9700 | | 0.0300 | 0.0 | 52.1 | 72.9 |
| 16* | 0.9900 | | | | | | | 1.0000 | 0.0100 | 0.0 | 24.9 | 62.2 |
| 17 | 1.0000 | | | | | | | 0.9995 | 0.0005 | 0.0 | 83.3 | 65.1 |
| 18 | 1.0000 | | | | | | | 0.9980 | 0.0020 | 0.0 | 83.3 | 64.8 |
| 19 | 1.0000 | | | | | | | 0.9900 | 0.0100 | 0.0 | 64.3 | 66.5 |
| 20 | 1.0000 | | | | | | | 0.9700 | 0.0300 | 0.0 | 53.5 | 68.9 |
| 21* | | 0.9900 | | | | | | 1.0000 | 0.0100 | 1.0 | 31.4 | 64.4 |

TABLE 1-continued

| Composition | Compositional Ratio | | | | | | | | | Quantum yield (%) * at irradiation with light of 340 nm (wavelength) | | Linear Transmittance (%) @700 nm |
| | A | | | | | B | | | | Before | After | After |
| Number | La | Y | Gd | Lu | Yb | Zr | Sn | Hf | Bi | Reduction | Reduction | Reduction |
|---|---|---|---|---|---|---|---|---|---|---|---|---|
| 22 | 1.0000 | | | | | | | 0.9995 | 0.0005 | 0.0 | 61.3 | 65.8 |
| 23 | 1.0000 | | | | | | | 0.9980 | 0.0020 | 0.3 | 70.4 | 68.7 |
| 24 | 1.0000 | | | | | | | 0.9900 | 0.0100 | 0.9 | 71.2 | 67.0 |
| 25 | 1.0000 | | | | | | | 0.9700 | 0.0300 | 1.3 | 65.5 | 63.0 |
| 26* | 0.9900 | | | | 1.0000 | | | | 0.0100 | 1.5 | 18.3 | 65.9 |
| 27 | 1.0000 | | | | | 0.9995 | | | 0.0005 | 0.0 | 61.8 | 71.4 |
| 28 | 1.0000 | | | | | 0.9980 | | | 0.0020 | 0.4 | 58.8 | 69.4 |
| 29 | 1.0000 | | | | | 0.9900 | | | 0.0100 | 0.6 | 60.4 | 69.9 |
| 30 | 1.0000 | | | | | 0.9700 | | | 0.0300 | 0.8 | 59.7 | 66.5 |
| 31* | | 0.9900 | | | | | | 1.0000 | 0.0100 | 0.6 | 21.3 | 70.6 |
| 32 | | 1.0000 | | | | | | 0.9995 | 0.0005 | 0.0 | 58.4 | 69.9 |
| 33 | | 1.0000 | | | | | | 0.9980 | 0.0020 | 0.0 | 63.1 | 65.2 |
| 34 | | 1.0000 | | | | | | 0.9900 | 0.0100 | 0.2 | 59.2 | 71.1 |
| 35 | | 1.0000 | | | | | | 0.9700 | 0.0300 | 0.5 | 56.0 | 68.6 |
| 36 | | 1.0000 | | | | 0.9900 | | | 0.0100 | 0.3 | 50.8 | 51.7 |
| 37 | | | | 1.0000 | | | | 0.9900 | 0.0100 | 0.9 | 70.3 | 64.8 |
| 38 | | 0.5000 | 0.5000 | | | 0.4950 | 0.4950 | | 0.0100 | 0.6 | 67.5 | 52.3 |
| 39 | 0.8000 | | 0.2000 | | | 0.9900 | | | 0.0100 | 0.1 | 71.2 | 73.1 |
| 40 | | | | 0.8000 | 0.2000 | | | 0.9900 | 0.0100 | 0.5 | 55.9 | 62.7 |

Figure 7:
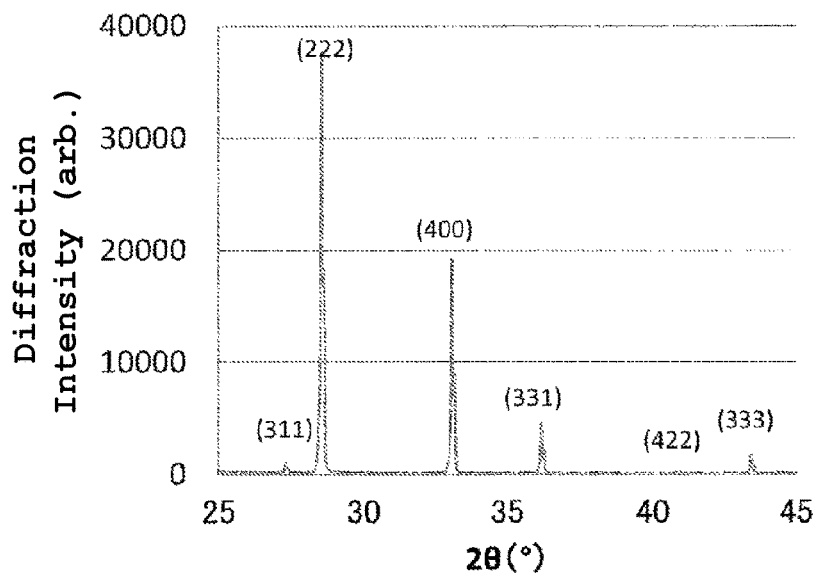
FIG. 7 is a graph showing the XRD analysis results of a sample corresponding to composition 8.

A graph showing the XRD analysis results of a sample (hereinafter, referred to as a "sample 8") corresponding to the composition 8 is shown in FIG. 7. It is found from a diffraction pattern shown in FIG. 7 that the resulting ceramic is a single-phase ceramic having a pyrochlore structure composed of La $Zr_2O_7$. Further, emission spectrometric analysis of the sample 8 was carried out, and consequently main components of the sample 8 were only La, Zr, and Bi.

Next, a sample (hereinafter, referred to as a "sample 2") corresponding to the composition 2, prepared in the composition in which the A site was poor, and a sample 8 prepared in the composition in which the B site was poor were subjected to XRF (X-ray fluorescence) composition analysis using a calcined product having the composition 2 as a standard of composition. The results are shown in Table 2.

TABLE 2

| | La | Zr | Bi |
|---|---|---|---|
| Sample 2 | 0.995 | 1.000 | 0.008 |
| Sample 8 | 1.000 | 0.992 | 0.007 |

It is verified from the results shown in Table 2 that a sintered body having the substantially on-target composition was obtained.

Figure 8:
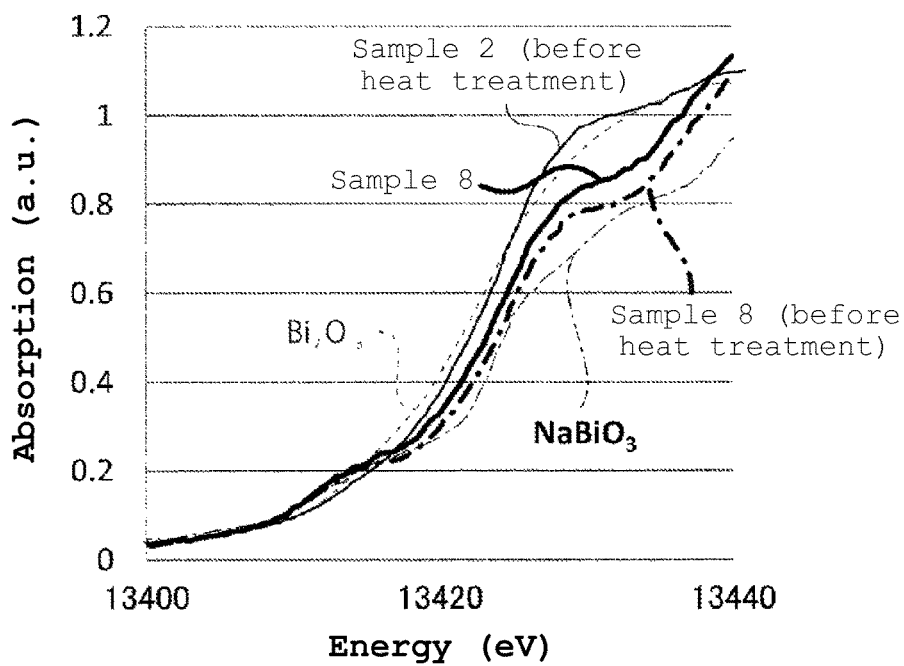
FIG. 8 is XANES spectra at an $L_3$ end of Bi in samples 2 and 8.
Figure 9:
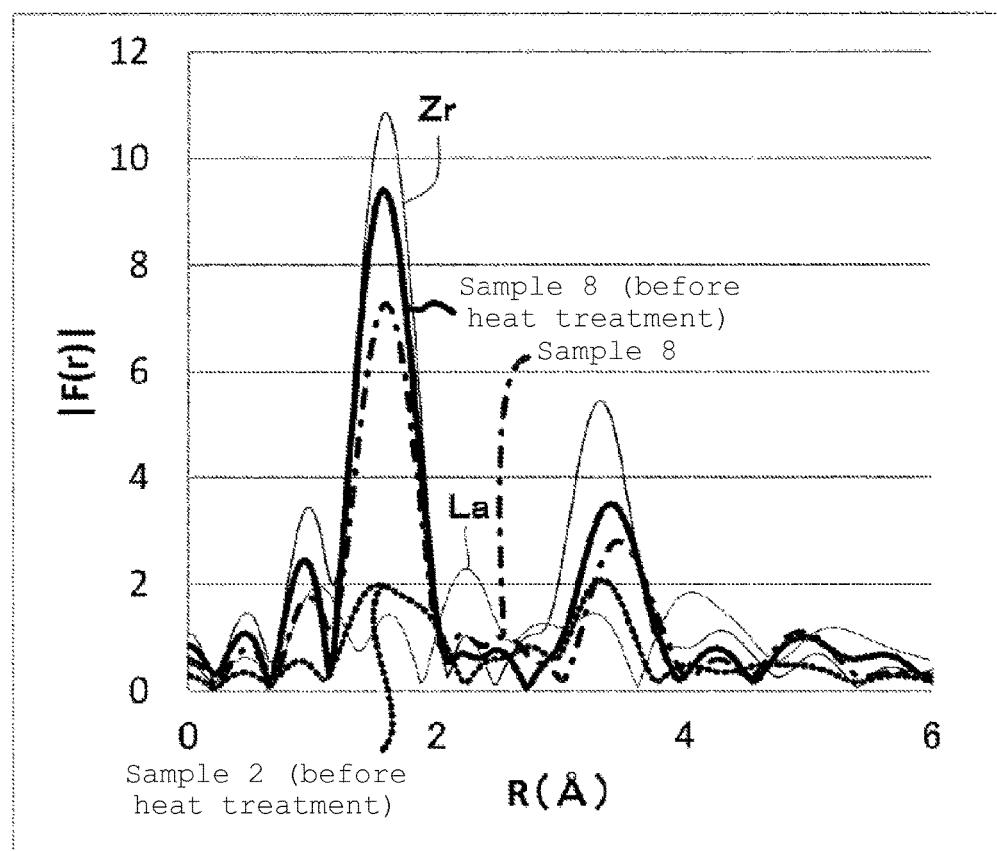
FIG. 9 is a radial distribution function obtained from EXAFS spectra of samples 2 and 8.

Next, in order to examine a valence and a substitution site of the added Bi, each of the sample 2 and the sample 8 was subjected to X-ray absorption fine structure (XAFS) spectrum analysis. The analysis was carried out at Photon Factory in High Energy Accelerator Research Organization. XANES spectra at an $L_3$ end of Bi are shown in FIG. 8. Radial distribution functions obtained from EXAFS spectra are shown in FIG. 9. In addition, in FIGS. 8 and 9, the function curve noted by "before heat treatment" is a data of the sample not subjected to heat treatment, and the function curve not noted by "before heat treatment" is a data of the sample subjected to heat treatment.

It is found from the results shown in FIG. 8 that there is a difference in a rising shape of an X-ray absorption curve between the sample 2 and the sample 8. Further, a shape of spectrum of the sample 2 is close to a shape of $Bi_2O_3$ spectrum, and a shape of spectrum of the sample 8 is close to a shape of $NaBiO_3$ spectrum.

It is found from the results shown in FIG. 9 that there is a difference also in the shape of the radial distribution function between the sample 2 and the sample 8, and the shape of the radial distribution function of Bi of the sample 2 is close to the shape of the radial distribution function of La, A-site ion, and the shape of the radial distribution function of Bi of the sample 8 is close to the shape of the radial distribution function of Zr, B-site ion.

It is found from these results that in the sample 2, Bi is introduced into the A site, and in the sample 8, Bi is introduced into the B site.

Further, it is found from the results shown in FIGS. 8 and 9 that by applying heat treatment, shapes of the XANES spectrum and the radial distribution function vary. It is thought from this that changes to a low valence side in the valence of a Bi ion and changes in a local structure around the Bi ion occur by heat treatment.

(Measurement of Linear Transmittance)

A linear transmittance in a visible light region of each of the heat-treated samples having the compositions 1 to 40 was measured by using UV-VIS Spectrophotometer UV-2500PC manufactured by SHIMADZU CORPORATION. The results at a wavelength of 700 nm are shown in Table 1.

(Measurement of Emission Quantum Yield)

The emission quantum yields of the samples having the compositions 1 to 40 by irradiation of ultraviolet-rays with a wavelength of 340 nm were measured by using an absolute PL quantum yields measurement system (C9920-02) manufactured by Hamamatsu Photonics K.K. In addition, with respect to each composition, the emission quantum yields of both of the samples not subjected to heat treatment and the samples subjected to heat treatment were measured. The results are shown in Table 1.

It is found from the results shown in Table 1 that the samples not subjected to heat treatment emit light very little in any of the composition 1 to composition 40. On the other hand, heat-treated samples exhibited emitted light in any of the compositions 1 to 40. However, in the sample having the composition 1, 2, 11, 16, 21, 26 or 31, which has Bi introduced into the A site, the emission quantum yield was low. The sample having other composition, which has Bi introduced into the B site, is found to exhibit an emission quantum yield higher than the sample having the composition 1, 2, 11, 16, 21, 26 or 31, which has Bi introduced into the A site even when the addition amount of Bi is the same.

Experiment Example 2

The calcined products of the composition 8 and the composition 34 shown in Table 1 were respectively put into a ball mill together with water, an organic dispersant and an organic binder, and wet-pulverized for 12 hours.

Each of the resulting pulverized products was shaped into a green sheet of 60 µm in thickness. The resulting green sheet was cut out into a piece of 10 mm square, and 15 pieces were overlaid and pressed at a pressure of 2 t/cm² to prepare a laminated compact of 10 mm square, having a thickness of about 0.8 mm.

Next, the laminated compact having the composition 8 and the laminated compact having the composition 34 were overlaid and pressed at a pressure of 2 t/cm² to prepare a laminated compact of 10 mm square, having a thickness of about 1.5 mm. The prepared laminated compact was fired at a temperature of 1700° C. for 20 hours in an oxygen atmosphere (oxygen concentration: about 98%) to obtain a sintered body. The resulting sintered body was heat-treated at a temperature of 1000° C. for 3 hours in a reduction atmosphere of a $N_2/H_2/H_2O$ mixed gas (oxygen partial pressure: $1 \times 10^{-13}$ MPa). Then, the resulting sintered body after reducing heat treatment was formed into a double-sided mirror substrate by mirror finishing having a thickness of 1.0 mm, and thereby, an evaluation sample was obtained. In addition, in thickness machining, both sides of the sintered body were cut by equal quantity. The prepared evaluation sample was the light-emitting element 11 shown in FIG. 2 and substantially the same as a light-emitting element in which the wavelength conversion unit 11a has the composition 8 and the wavelength conversion unit 11b has the composition 34.

On each of the evaluation sample prepared in Experiment Example 2, the heat-treated sample having the composition 8, which was prepared in Experiment Example 1 and the heat-treated sample having the composition 34, spectrofluorometric measurement at the time of irradiation with ultraviolet rays having a wavelength of 360 nm was conducted using a multichannel analyzer (PMA-12) manufactured by Hamamatsu Photonics K.K. The results are shown in FIG. 10.

Figure 10:
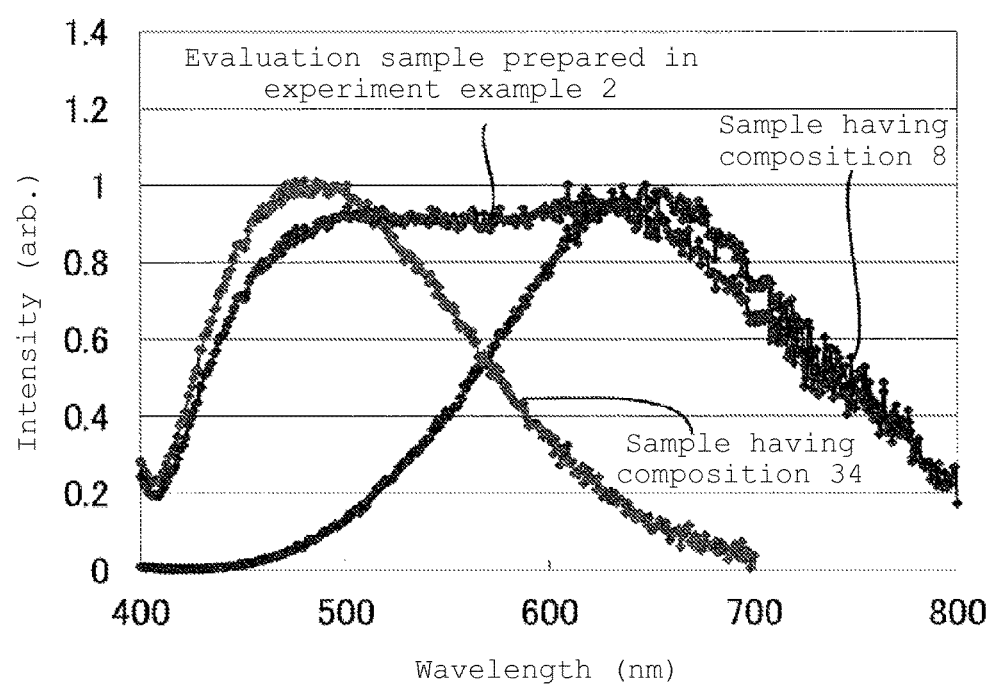
FIG. 10 is a view showing emission spectra of an evaluation sample prepared in Experiment Example 2, a heat-treated sample having the composition 8 and a heat-treated sample having the composition 2, which were respectively prepared in Experiment Example 1.

It is found from the results shown in FIG. 10 that broadband emitted light can be obtained from the evaluation sample prepared in Experiment Example 2. The correlated color temperature (K), the duv value, the general color rendering index Ra, and the special color rendering indexes R9 to R15 in the evaluation sample prepared in Experiment Example 2 are shown in Table 3. Herein, the term "correlated color temperature" refers to a temperature of a black body at a point on an orbit of black-body radiation, the point being located at a position closest to a chromaticity coordinate of light emission in the CIE 1960 uv chromaticity diagram, and the "duv" represents a distance therebetween. Further, the term "color rendering evaluation index" is an index indicating how faithfully a color of an object obtained in irradiating the object with light of a reference light source is reproduced, and the index closer to 100 is determined to have better color rendering properties. In addition, the term "general color rendering index" indicates an average value of color rendering evaluation indexes in test colors No. 1 to No. 8 specified by JIS Z 8726. The term "special color rendering index" indicates color rendering evaluation indexes of test colors No. 9 to No. 15.

TABLE 3

| Sample No. | Correlated Color Temperature | duv | General Color Rendering Index (Ra) | R9 | R10 | R11 | R12 | R13 | R14 | R15 |
|---|---|---|---|---|---|---|---|---|---|---|
| 100 | 4800 K | 0.006 | 97 | 94 | 94 | 95 | 96 | 98 | 98 | 99 |

It is found from the results shown in Table 3 that white light having such extremely excellent color rendering properties that almost color rendering evaluation indexes are 95 or more can be obtained from the evaluation sample prepared in Experiment Example 2.

DESCRIPTION OF REFERENCE SYMBOLS

1,1a~1f Light-emitting device
11 Light-emitting element
11a,11b Wavelength conversion unit
12 Substrate
13 Reflector
13a Through hole
14 Epitaxial wafer
30 Light source
31 Anode electrode
32 P-type layer
33 Emission layer
34 N-type layer
35 Cathode electrode

The invention claimed is:
1. A light-emitting ceramic comprising:
  a ceramic containing, as a major component thereof, a pyrochlore compound represented by $ABO_w$, wherein
  A includes at least one first element, and the at least one first element is selected from the group consisting of La, Y, Gd, Yb and Lu,
  B includes at least one second element, and the at least one second element is selected from the group consisting of Zr, Sn and Hf, and at least some of the at least one second element included in the B is substituted with Bi, and
  W is a positive number.
2. The light-emitting ceramic according to claim 1, wherein the Bi in an amount of 0.001 mol % to 5 mol %.
3. The light-emitting ceramic according to claim 1, wherein the Bi in an amount of 0.01 mol % to 3 mol %.
4. The light-emitting ceramic according to claim 1, wherein the B Bi in an amount of 0.05 mol % to 1 mol %.

5. The light-emitting ceramic according to claim 1, wherein a light transmittance in a wavelength of 450 nm to 800 nm when a thickness of the ceramic is 1 mm is 50% or more.

6. The light-emitting ceramic according to claim 1, wherein a light transmittance in a wavelength of 450 nm to 800 nm when a thickness of the ceramic is 1 mm is 60% or more.

7. The light-emitting ceramic according to claim 1, wherein a light transmittance in a wavelength of 450 nm to 800 nm when a thickness of the ceramic is 1 mm is 70% or more.

8. The light-emitting ceramic according to claim 1, wherein an emission quantum yield achieved when the light-emitting ceramic is irradiated with excitation light is 40% or more.

9. The light-emitting ceramic according to claim 1, wherein an emission quantum yield achieved when the light-emitting ceramic is irradiated with excitation light is 50% or more.

10. The light-emitting ceramic according to claim 1, wherein an emission quantum yield achieved when the light-emitting ceramic is irradiated with excitation light is 60% or more.

11. The light-emitting ceramic according to claim 1, wherein the pyrochlore compound is $La(Zr_{(1-x)}Bi_x)O_W$, and x is 0.0001 to 0.01.

12. The light-emitting ceramic according to claim 11, wherein x is 0.0005 to 0.005.

13. The light-emitting ceramic according to claim 1, wherein the A does not contain Bi.

14. A light-emitting element comprising a wavelength conversion unit containing the light-emitting ceramic according to claim 1.

15. A light-emitting device comprising:
the light-emitting element according to claim 14, and
a light source which emits excitation light to the light-emitting element.

16. The light-emitting element according to claim 14, wherein the wavelength conversion unit is a first wavelength conversion unit, the light-emitting element further comprising a second wavelength conversion unit, the second wavelength conversion unit a different emission wavelength from the first wavelength conversion unit.

17. A light-emitting device comprising:
the light-emitting element according to claim 16, and
a light source which emits excitation light to the light-emitting element.

18. A light-emitting element comprising:
a first wavelength conversion unit; and
a second wavelength conversion unit,
wherein the first and second wavelength conversion units contain the light-emitting ceramic according to claim 1.

19. A light-emitting device comprising:
the light-emitting element according to claim 18, and
a light source which emits excitation light to the light-emitting element.

* * * * *